United States Patent [19]

Beinitz et al.

[11] 4,198,607
[45] Apr. 15, 1980

[54] INPUT CIRCUIT FOR A MEASURING AMPLIFIER DEVICE

[75] Inventors: Karl Beinitz, Cologne; Volker Kaltenbach, Bensberg, both of Fed. Rep. of Germany

[73] Assignee: Leybold-Heraeus GmbH & Co. Kommanditgesellschaft, Cologne, Fed. Rep. of Germany

[21] Appl. No.: 909,436

[22] Filed: May 25, 1978

[30] Foreign Application Priority Data

May 25, 1977 [DE] Fed. Rep. of Germany ....... 2723609

[51] Int. Cl.² .......................... G06G 7/12; G01R 1/30
[52] U.S. Cl. ............................... 328/143; 324/123 C; 330/110; 330/148
[58] Field of Search ................... 330/110, 148; 328/142–145; 324/123 R, 123 C, 116; 307/230, 363

[56] References Cited

U.S. PATENT DOCUMENTS

| | | | |
|---|---|---|---|
| 3,268,813 | 8/1966 | Pendleton | 324/132 |
| 3,360,723 | 12/1967 | Royce | 328/116 X |
| 3,371,224 | 2/1968 | Polo | 307/230 X |
| 3,543,168 | 11/1970 | Weill | 307/230 X |
| 3,614,444 | 10/1971 | Nirschl | 330/110 X |
| 3,807,816 | 4/1974 | Hamburg | 328/143 |
| 3,930,202 | 12/1975 | Dever | 328/145 X |
| 3,997,845 | 12/1976 | Wegstedt | 328/143 |
| 4,011,504 | 3/1977 | DePillo | 328/143 X |
| 4,030,039 | 6/1977 | Fahlgren | 328/143 X |
| 4,085,374 | 4/1978 | Nagahama | 328/143 |

*Primary Examiner*—James B. Mullins
*Attorney, Agent, or Firm*—Spencer & Kaye

[57] ABSTRACT

A measuring amplifier device is provided with an input circuit producing different functions of an input signal in order to permit output signals in different measuring ranges to be produced. The circuit can be constituted by an operational amplifier having a feedback connection composed of a series arrangement of several elements each defining a particular measuring range together with subtraction stages forming signals corresponding to each range, or by a plurality of diodes or diode-resistor networks connected to divide the input signal between them and each defining a different measuring scale.

6 Claims, 6 Drawing Figures

INPUT CIRCUIT FOR A MEASURING AMPLIFIER DEVICE

BACKGROUND OF THE INVENTION

The present invention relates to a measuring amplifier of the type including an operational amplifier provided with a feedback-connected element which determines the amplifier measuring range.

The feedback-connected element may be, for example, a resistor which defines a linear measuring range. The higher its resistance, the more sensitive is the measuring amplifier.

Another element in the feedback branch of the measuring amplifier may be, for example, a diode which is basically a resistor with a logarithmic characteristic. It causes the measuring amplifier to have a logarithmic measuring range. It is known, for example, to provide one diode and a plurality of different resistors each of which can be selectively connected in the feedback branch with the aid of a measuring range switch.

While linear measuring ranges are used predominantly for measuring purposes because of the arbitrarily selectable sensitivity graduation, i.e. up to $10^{-12}$ A, and the high accuracy, i.e. about 1%, the logarithmic measuring range, which usually extends across all of the linear ranges, serves for control and regulating purposes. In many cases it is then desired to have, for example, the measured signal and the regulating signal available at the same time. This requirement becomes the more difficult to satisfy as more stringent performance requirements are placed on the measuring amplifier, for example with respect to sensitivity, measuring accuracy and number of decades in the logarithmic measuring range. In the case of measuring amplifiers capable of measuring currents down into the pA range, with permissible measuring accuracies in the linear ranges of about 1%, and with a logarithmic range of 6 to 8 decades, it has thus far been impossible to obtain simultaneous measurements in the logarithmic and linear scales. A compromise solution is the use of two measuring instruments with two separate sensors as the current supply sources. However, it has not been possible to realize this in a practical manner and was thus impossible to have two signals available simultaneously. If the compromise solution could be realized, it would entail very high expenses.

SUMMARY OF THE INVENTION

It is therefore an object of the present invention to provide an input circuit for a measuring amplifier which permits the measuring amplifier to be given the capability of making two signals, e.g. a linear measuring signal and a logarithmic control signal, available simultaneously even for the most sensitive measuring ranges, and this with only one input signal.

This and other objects are accomplished according to the present invention by providing an input circuit composed of an operational amplifier connected to receive the input current and a plurality of elements connected in series in a feedback branch of the amplifier, each element determining one measuring range.

In a circuit of this type a signal is obtained at the output of the operational amplifier whose magnitude is determined by the sum of the functions determined by the elements. A signal is also available at each point of connection between a pair of adjacent individual elements, the magnitude of that signal being determined by the sum of the functions of those components through which measuring current flows up to the respective connection point. By suitable subtraction, in a known manner, of the available signals, as many output signals can be produced as there are elements present in the feedback branch, the magnitude of the output signals corresponding to the characteristics of the individual elements which define the different measuring ranges.

Advisably, the signals are obtained between the individual elements in the feedback branch via impedance transformers. Sensitivity and accuracy of the circuit are then not adversely influenced.

Further operational amplifiers can be used for the subtraction operations. Their output signals may be further amplified in a known manner or, for a logarithmic signal, provided with a compensation voltage which fixes the reference value for the signal.

According to another embodiment of the invention, the current to be measured is divided by means of diodes and/or diode-resistor networks and an independent measuring channel is provided for each current branch so as to form a plurality of output signals, preferably in different amplitude scales. With such arrangement of the input connections of a measuring amplifier circuit, the current to be measured is divided in such a manner that a large dynamic range is possible, i.e. even if the dynamic range of the current to be measured is large, the voltage at the distributor network is changed only insignificantly.

With fixed series resistance, the current to be measured can be divided into two or more identical components ahead of the parallel connected measuring amplifiers only for a very small dynamic range of the current to be measured. However, when measuring low and very low currents it is necessary to provide a large dynamic range. The reason why fixed resistances cannot be used for measuring such currents with a large dynamic range, is mainly that the voltage across the series resistances varies to the same degree, i.e. has the same dynamic range, as the currents to be measured. This is not the case with diodes. The invention thus makes advantageous use of the logarithmic curve of the current-voltage characteristic of diodes. It is advisable, in order to produce uniform measured values, for the curves of the characteristics of the diodes used in a circuit according to the invention to coincide with one another.

BRIEF DESCRIPTION OF THE DRAWINGS

FIGS. 4, 4a, 4b and 4c are diagrams of various component units that can be used in the embodiment of FIG. 3.

DESCRIPTION OF THE PREFERRED EMBODIMENTS

Figure 1:
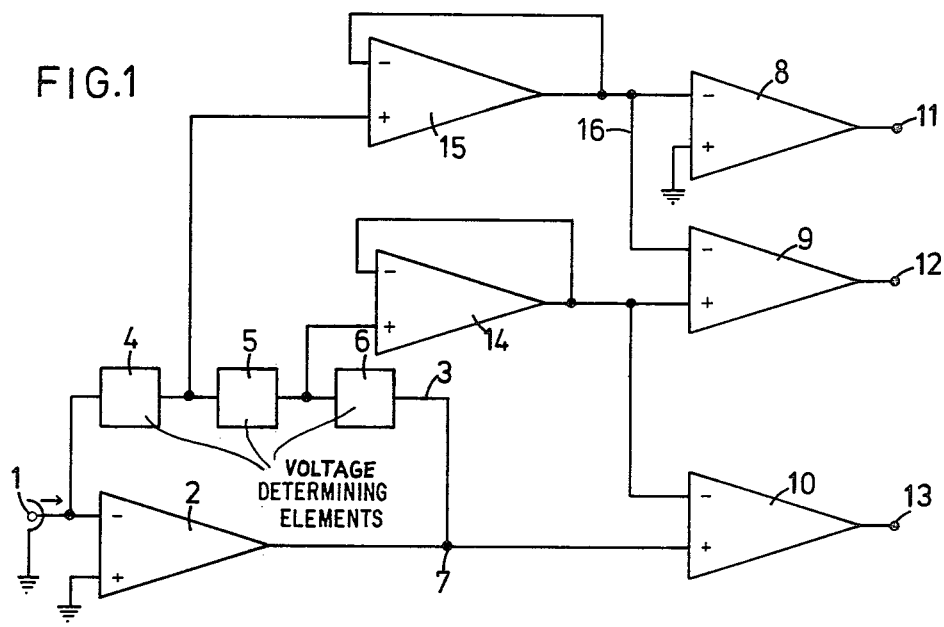
FIG. 1 is a basic circuit diagram of a circuit constructed according to a preferred embodiment of the invention.

In the embodiment shown in FIG. 1, the current to be measured is fed from input 1 to the inverting input of an operational amplifier 2. Amplifier 2 has a feedback branch 3 connected between its output 7 and inverting input. Feedback branch 3 is composed of a series arrangement of three elements 4, 5 and 6. Each such element would, if provided alone in such a feedback branch, define a certain measuring range determined by its particular characteristic, i.e. each would determine the function of the output signal at terminal 7 with respect to the input signal at terminal 1, or in other words, the relationship between the output and input signals.

Due to the fact that the elements 4, 5 and 6 are connected in series with one another in feedback branch 3, a voltage is obtained at the output 7 of the operational amplifier 2 whose magnitude, relative to a reference potential, is proportional to the sum of the functions of the input current determined by elements 4, 5 and 6. Between elements 4 and 5 a voltage is produced whose magnitude is determined by the function defined by element 4. The voltage between elements 5 and 6 is of a magnitude which is proportional to the sum of the functions defined by elements 4 and 5.

Therefore, it is possible, with the aid of stages 8, 9 and 10, which can also be constituted by schematically illustrated operational amplifiers, to obtain signals at the outputs 11, 12 and 13 which correspond to the individual functions defined by elements 4, 5 and 6. Outputs 11, 12 and 13 are followed by switching devices (not shown) which serve to further process the signals in an analog or digital manner.

In the illustrated embodiment one difference signal is formed in subtraction stage 10. The minuend is the sum signal fed to the direct input of amplifier 10 from the output 7 of the operational amplifier 2. The value of this sum signal is proportional to the sum of the signals determined by the characteristics of elements 4 to 6. The subtrahend fed to the inverting input of subtraction stage 10 is derived from the signal obtained between elements 5 and 6 by conducting this signal via an impedance transformer 14 to the inverting input of stage 10. The signal to that inverting input thus has a value which corresponds to the sum of the signals determined by the characteristics of elements 4 and 5. At the output 13 there thus appears a signal whose value is determined only by the function defined by element 6.

The signal present between elements 4 and 5, which is thus a function of the characteristic of element 4, is supplied to a second impedance transformer 15 whose output is connected to the inverting input of stage 8. The direct input of stage 8 is connected to a source of reference potential, e.g. ground. At output 11 there thus appears a signal whose magnitude is proportional to the function determined by element 4. Each of impedance transformers 14 and 15 can, as shown, be constituted by an operational amplifier having a feedback connection between its output and inverting input so as to have an effective gain of unity.

In addition, the signal supplied to the inverting input of stage 8 is also fed, as a subtrahend signal, via line 16 to the inverting input of subtraction stage 9. The signal obtained between elements 5 and 6 is fed, as a minuend signal, to the direct input of subtraction stage 9 via the impedance transformer 14 so that a signal can be obtained at output 12 whose value corresponds to the function determined by element 5.

Figure 2:
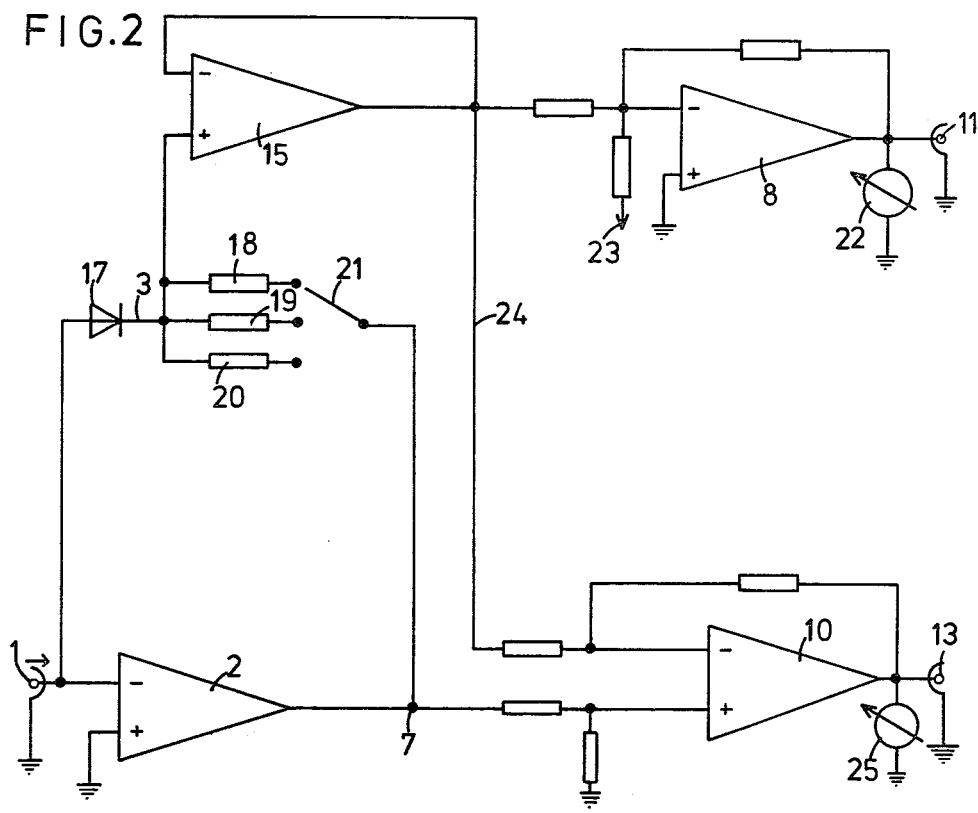
FIG. 2 is a circuit diagram of an embodiment of the invention for the formation of linear and logarithmic output signals.

FIG. 2 shows a more specific embodiment of a circuit according to the invention. In this circuit a diode 17 and a selected one of a plurality of resistors 18, 19 and 20 are connected in series in the feedback branch 3 of the operational amplifier 2. The selective connection of one of the resistors is effected by a multiposition switch 21, which could be an electronic switch.

Between the diode 17 and the respectively connected resistor a signal is obtained which, due to the logarithmic character of the diode 17, defines a measuring range having a logarithmic characteristic. This signal is fed via impedance transformer 15 to the inverting input of operational amplifier 8 at whose output 11 the amplified logarithmic signal can be obtained. A display on a logarithmic scale is provided by a suitable indicator device 22. At line 23 a compensation voltage is fed in, as required for logarithmic measuring ranges, so as to fix the zero point for the signal measurement.

At the output 7 of the operational amplifier 2, a signal is obtained whose value corresponds to the sum of the logarithmic function determined by diode 17 and the linear function determined by the connected one of resistors 18, 19 and 20. This signal is fed as a minuend to the direct input of subtraction stage 10. The subtrahend for stage 10 is the output signal from the impedance transformer 15 which is supplied to the inverting input of stage 10 via line 24. Thus a signal appears at the output 13 of the subtraction stage 10 which signal is a linear function of the input signal, the value of the function being determined by the characteristic of the particular resistor that is switched on. The signal at output 13 is displayed in a suitable indicator device 25.

If a further measuring range were to be provided, simultaneously, feedback branch 3 could be supplemented by an additional element, e.g. a further resistor, and components 9 and 14 could be added.

Figure 3:
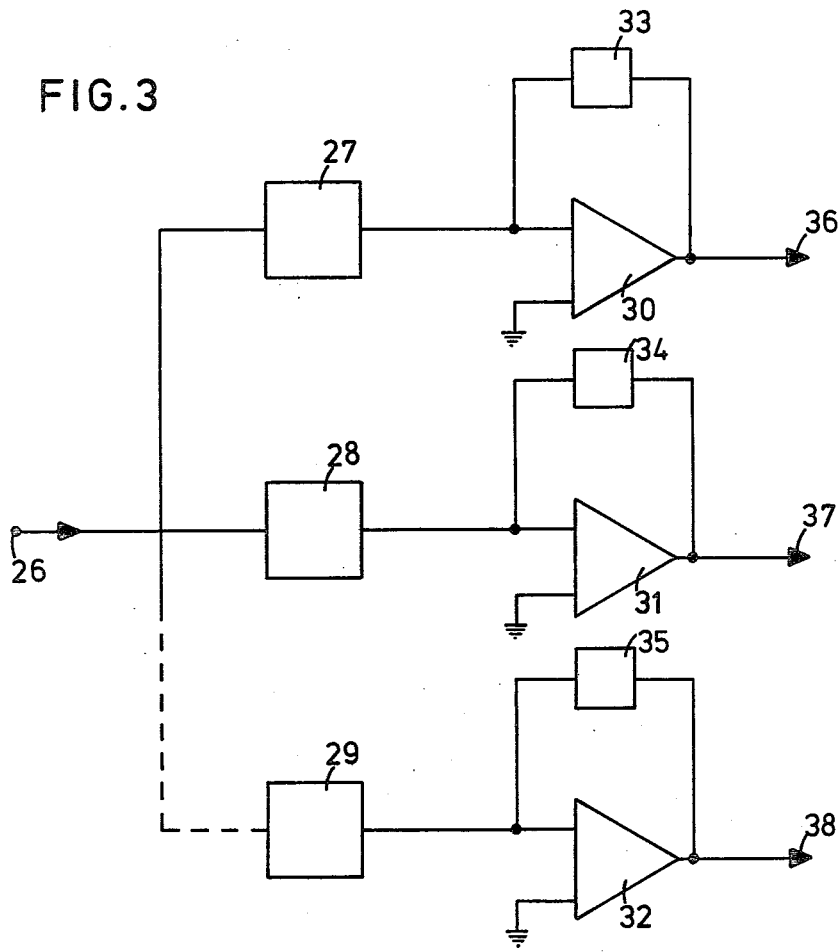
FIG. 3 is a circuit diagram of an embodiment of an input circuit according to the invention employing diodes.

In the embodiment of FIG. 3, the input current received at terminal 26 is divided between diodes or diode-resistor networks 27, 28 and 29. The partial currents are fed to independent measuring channels which each have a respective operational amplifier 30, 31 or 32. In the feedback branches of these operational amplifiers there are connected elements 33, 34 and 35 whose characteristics determine the scales of the signals appearing at outputs 36, 37 and 38 of the operational amplifiers.

Figure 4A:
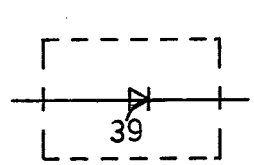
Figure 4B:
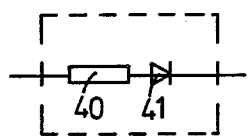
Figure 4C:
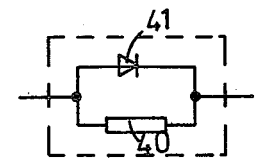

FIGS. 4a, 4b and 4c show three possible ways of constructing each of blocks 27, 28 and 29 of FIG. 3. These blocks may be constituted, for example, by a single diode 39, as shown in FIG. 4a, or by a series connection of a resistor 40 and a diode 41, as shown in FIG. 4b, or by a parallel connection of resistor 40 and diode 41, as shown in FIG. 4c. Finally, there exists the possibility of using combinations of these three circuit units. Such a circuit makes it possible to divide low and very low input currents with a large dynamic range and to feed them to independent measuring channels.

In preferred embodiments of the circuit of FIG. 3, the diodes 39, 41 have characteristics which coincide with one another.

By means of the blocks 27, 28 and 29, consisting, for example, all of diodes or all of diode-resistor networks, the current to be measured is divided into partial currents for the independent measuring channels. The more equal the characteristics of the diodes, the more equal will be the partial currents.

The blocks 33, 34 and 35 constitute linear or nonlinear (diodes) resistors. They determine, as described earlier herein, the scale or measuring range, or at least the voltage, of each output signal relative to the input signal.

Since the circuits according to the invention contain only integratable components, it is possible to combine these components by themselves or together with other components or integrated modules, for example together with the associated operational amplifier, into an integrated circuit.

It will be understood that the above description of the present invention is susceptible to various modifications, changes and adaptations, and the same are intended to be comprehended within the meaning and range of equivalents of the appended claims.

What is claimed is:

1. A circuit for measuring an input current comprising: a plurality of networks each comprising a diode, each defining a respective measuring range, and each connected to receive the input current so that such current is divided among said networks; a plurality of independent measuring channels each connected to receive the signal from a respective network and each providing an output signal representative of the amplitude of the input current on a respectively different amplitude scale; and a plurality of output terminals each connected to receive the output signal from a respective channel and to be electrically isolated from one another by said channels.

2. A circuit as defined in claim 1 wherein each said channel comprises a respective operational amplifier.

3. A circuit as defined in claim 1 wherein at least one of said networks further comprises a resistor connected in circuit with said diode.

4. A circuit as defined in claim 1 wherein all of said diodes have coinciding characteristics.

5. A circuit as defined in claim 1 constituted by an integrated circuit.

6. A circuit as defined in claim 1 wherein each said diode is connected in series between the source of the input current and the input of its associated measuring channel.

* * * * *